(12) United States Patent
Shimoto et al.

(10) Patent No.: US 6,333,136 B1
(45) Date of Patent: Dec. 25, 2001

(54) CARRIER FILM AND PROCESS FOR PRODUCING THE SAME

(75) Inventors: Tadanori Shimoto; Koji Matsui, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/661,801

(22) Filed: Sep. 14, 2000

Related U.S. Application Data

(62) Division of application No. 09/140,648, filed on Aug. 26, 1998, now Pat. No. 6,156,414.

(30) Foreign Application Priority Data

Aug. 26, 1997 (JP) ..................................................... 9-229454

(51) Int. Cl.⁷ .................................................. G03C 1/725
(52) U.S. Cl. ........................... 430/281.1; 430/18; 430/56; 428/209
(58) Field of Search ............... 428/209; 430/18, 430/56, 281.1

(56) References Cited

U.S. PATENT DOCUMENTS

| | | | |
|---|---|---|---|
| 4,684,678 | 8/1987 | Schultz et al. | 525/423 |
| 5,153,051 | 10/1992 | Dorinski | 428/209 |
| 5,403,683 | 4/1995 | Ohta et al. | 428/209 |
| 5,539,064 | 7/1996 | Hashimoto et al. | 430/280.1 |
| 5,700,607 | 12/1997 | Rath et al. | 430/15 |
| 5,830,563 | 11/1998 | Shimoto et al. | 428/421 |
| 5,889,233 | 3/1999 | Shimoto et al. | 428/209 |

FOREIGN PATENT DOCUMENTS

| | | |
|---|---|---|
| 61-98725 | 5/1986 | (JP) . |
| 4-292611 | 10/1992 | (JP) . |
| 5-70528 | 3/1993 | (JP) . |
| 6-230571 | 8/1994 | (JP) . |
| 8-50353 | 2/1996 | (JP) . |

OTHER PUBLICATIONS

S. Matsuda et al., "Development of Molded Fine–pitch Ball Grid Array (FPBGA) Using Through–Hole Bonding Process", IEEE Electronics Components and Technology Conference, May 28–31, 1996, pp. 727–732.

*Primary Examiner*—Cathy Lam
(74) *Attorney, Agent, or Firm*—Sughrue Mion, PLLC

(57) ABSTRACT

The present invention provides a carrier film in which a cover resist layer made of epoxy acrylate resin including a fluorene skeleton is formed on a heat-resistant resin film including a conductive wiring pattern. The carrier film has heat resistance, moisture resistance, and close contact property, as well as chemical resistance in a plating process or the like, and does not warp because contraction in resin hardening is small.

1 Claim, 3 Drawing Sheets

CARRIER FILM AND PROCESS FOR PRODUCING THE SAME

This is a divisional of application Ser. No. 09/140,648 filed Aug. 26, 1998, now U.S. Pat. No. 6,156,414, the disclosure of which is incorporated herein by reference.

BACKGROUND OF THE INVENTION

1. Field of the Invention

The present invention relates to a carrier film into which a semiconductor device is suitably mounted at high-density and to a process for producing the same.

2. Description of the Related Art

As a carrier film into which the semiconductor device is mounted, there is a conventionally known carrier film as disclosed in pages 727 to 732 of the 46th Electric Component & Technology Conference, for example. FIG. 1 is a schematic sectional view showing such a construction. In FIG. 1, tape matrix 34 comprising a copper wiring pattern 31, a base layer 32 made from polyimide film, and a bonding layer 33 made from thermoplastic polyimide film is provided with a bump 35 for electrical connection to a chip, and a cover resist layer 37 having openings 36 for electrical connection to a substrate to be mounted is defined on the copper wiring pattern 31.

In the carrier film having the above construction, quality of material and forming conditions of the cover resist layer 37 have a great influence on process margin and reliability in assembly of the semiconductor device. Properties required for the cover resist layer 37 are heat resistance, moisture resistance, close-contact property, chemical resistance in a plating process or the like, and smaller contraction in hardening of resin to prevent warping of the carrier film. Furthermore, in order to keep up with refinement of openings 36 due to increased number of pins in the semiconductor device, it is desirable to form the cover resist layer 37 in exactly the same exposure and developing process as those for a normal photoresist.

Epoxy acrylate resin or polyimide resin disclosed in Japanese Patent Application Laid-open No. 6-230571 or Japanese Patent Application Laid-open No. 8-50353, for example, is known as material of the cover resist. However, the conventional epoxy acrylate resin does not have sufficient heat resistance, causing degradation in insulation due to sag of pattern or carbonization in an assembling process of the semiconductor device. Further, the conventional epoxy acrylate resin does not have sufficient moisture resistance and chemical resistance and can not form a reliable semiconductor device. On the other hand, the polyimide resin has sufficient heat resistance of 300° C. or more. However, the polyimide resin contracts largely at the time of hardening to cause warping, and is necessary to be heated at temperature of as high as 300° C. or more for hardening, such heat degrading the bonding layer 33. For the above reasons, it is very difficult to apply the polyimide resin to the carrier film.

SUMMARY OF THE INVENTION

It is an object of the present invention to provide a carrier film in which a cover resist layer is formed on a heat-resistant resin film including a conductive wiring pattern, the cover resist layer having heat resistance, moisture resistance, close contact property, chemical resistance in a plating process or the like, and does not warp because contraction in resin hardening is small.

To achieve the above object of the present invention, there is provided a carrier film in which a cover resist layer made of epoxy acrylate resin including a fluorene skeleton is formed on a heat-resistant resin film including a conductive wiring pattern. Furthermore, the carrier film which is remarkably flexuous and facilitates assembly of a semiconductor device can be obtained by forming the cover resist layer made of the epoxy acrylate resin including the fluorene skeleton by heating at temperature in a range of 180° C. to 260° C. for hardening.

Because the epoxy acrylate resin including the fluorene skeleton used in the present invention has photosensitivity, a through hole can be formed in a photo process like in a case where normal resist material is used. Also, the hardened film has heat resistance of 300° C. or more and contraction of the film is small when hardened, thereby preventing warping of the carrier film.

DESCRIPTION OF THE PREFERRED EMBODIMENT

A preferred embodiment of the present invention will be explained below with reference to accompanying drawings.

Figure 1:
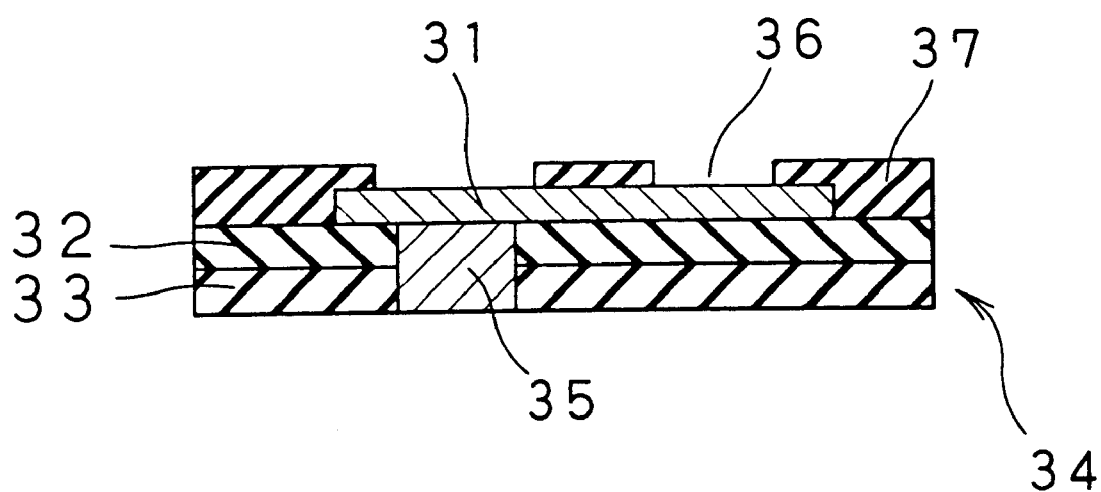
FIG. 1 is a sectional view showing a construction of a conventional carrier film.
Figure 2A:
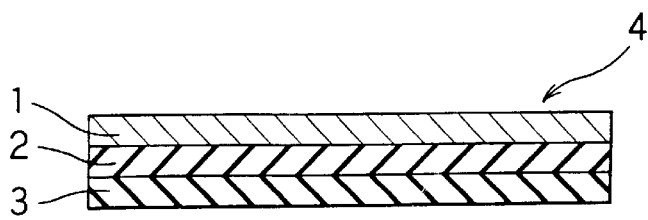
FIGS. 2A to 2E are sectional views showing a process for producing a carrier film according to an embodiment of the present invention in order of step.
Figure 2B:
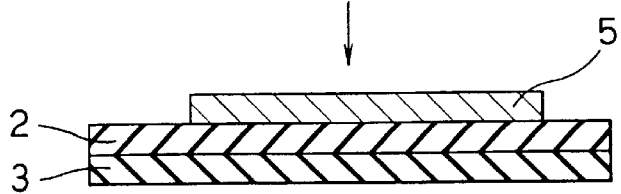
Figure 2C:
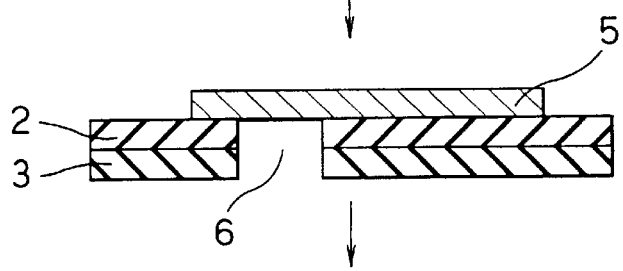
Figure 2D:
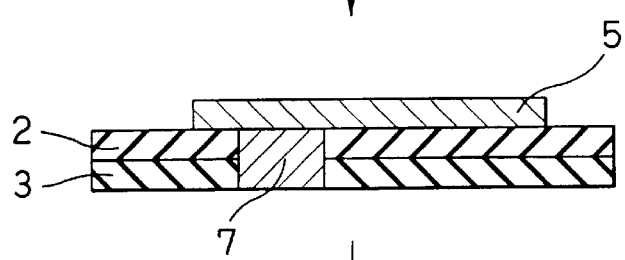
Figure 2E:
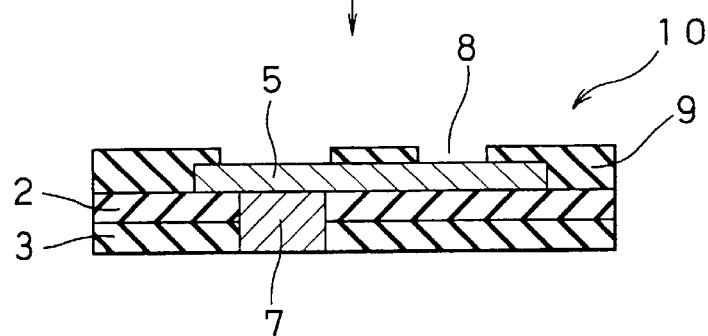
Figure 3:
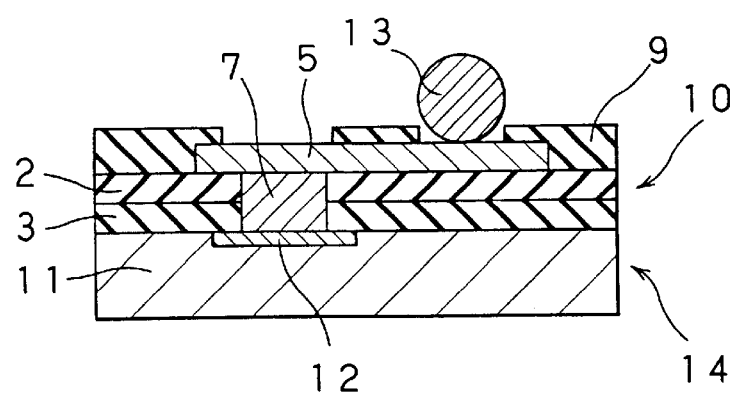
FIG. 3 is a diagram showing an example of a structure of a semiconductor device using the carrier film according to the present embodiment.

FIG. 3 is a sectional view showing a semiconductor device assembled using a carrier film according to the embodiment of the present invention. FIGS. 2A to 2E are sectional views showing a process for producing the carrier film according to the embodiment of the present invention in order of step.

An electrode 12 connected to an internal circuit is formed on a surface of a semiconductor substrate 11, and a carrier film 10 is bonded to a top of the semiconductor substrate 11. The carrier film 10 includes a bonding layer 3 as its lowermost layer, and a base layer 2 is formed on the bonding layer 3. A wiring pattern 5 made of copper and formed by patterning a copper foil 1 is provided on the base layer 2.

A bump 7 connected to the wiring pattern 5 is provided through the base layer 2 and the bonding layer 3. A cover resist 9 is formed to cover the base layer 2 and the wiring pattern 5, and openings 8 are provided at appropriate positions of the cover resist 9 on the wiring pattern 5.

In the present embodiment, the cover resist 9 is made of epoxy acrylate resin including a fluorene skeleton. As the epoxy acrylate resin including the fluorene skeleton, material represented by the following general formula (1) is preferably used.

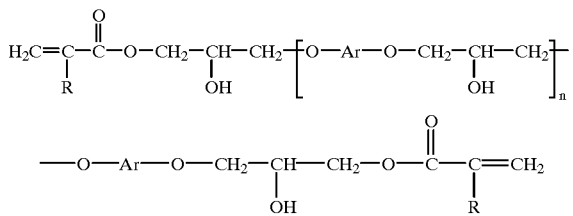

(1)

In formula (1), R represents a hydrogen atom or a low-rank alkyl group, n represents an integral number from 0 to 20, and —Ar— represents a divalent group represented by a following formula (2). R in a formula (II) also represents the hydrogen atom or the lower alkyl group like in the formula (1).

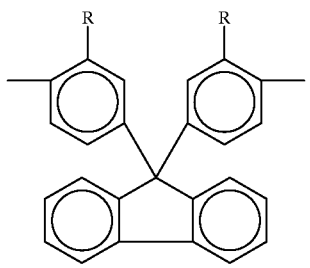

(2)

Use of the material represented by the formula (1) for an optical purpose is disclosed in the Japanese Patent Application Laid-open No. 4-292611.

It was found that the epoxy acrylate resin including the fluorene skeleton represented by the formula (1) has excellent heat resistance, moisture resistance, and chemical resistance, and is flexuous so that it can be formed on a film, as compared with conventional epoxy acrylate resin. Especially, it was found that the epoxy acrylate resin including the fluorene skeleton represented by the formula (1) forms a remarkably flexuous film, if a hardening temperature is set in a range of 180° C. to 260° C.

Next, a process for producing the carrier film of the present embodiment will be described with reference to FIGS. 2A to 2E. First, as shown in FIG. 2A, the bonding layer 3 for mechanical bonding to semiconductor elements is provided on one face of the base layer 2 made of polyimide resin or the like. On the other face of the base layer 2, the copper foil 1 for forming the wiring pattern is provided.

Then, as shown in FIG. 2B, the copper foil 1 is etched into a predetermined shape in a photo-lithography process and the like to form the copper wiring pattern 5.

Next, as shown in FIG. 2C, a through hole 6 is formed using a carbon dioxide laser and the like, and as shown in FIG. 2D, the bump 7 is formed for an electrical connection to the semiconductor element, by filling the through hole 6 with metal by plating.

Further, as shown in FIG. 2E, the epoxy acrylate resin including the fluorene skeleton is coated on an entire face of the copper wiring pattern 5 and an entire exposed face of the base layer 2 in a spin-coating process, a die-coating process, a curtain-coating process, a print process, or the like, for example, and dried to form a coat. Exposure is carried out through a mask, and developing is conducted, to obtain a cover resist 9 having openings 8. Finally, the over resist 9 is hardened by heating, to obtain the carrier film 10 of the present invention.

By mechanically bonding the carrier film 10 to the semiconductor substrate 11 through the bonding layer 3, the electrode 12 on the semiconductor substrate is electrically connected to the bump 7, as shown in FIG. 3. In the opening 8, a solder ball 13 is mounted, for example, to obtain semiconductor device 14 with excellent reliability.

In the assembling process of the semiconductor device 14, it is desirable to use the carrier film 10 in a shape of reel, in order to improve productivity. Therefore, the cover resist layer 9 which forms the carrier film 10 is desirably flexuous for easier handling. As a result of study, it was found that the cover resist layer 9 made of the epoxy acrylate resin including the fluorene skeleton forms a film which is remarkably flexuous, when the film is formed by heating at temperature in a range of 180° C. to 260° C. for hardening.

Figure 4:
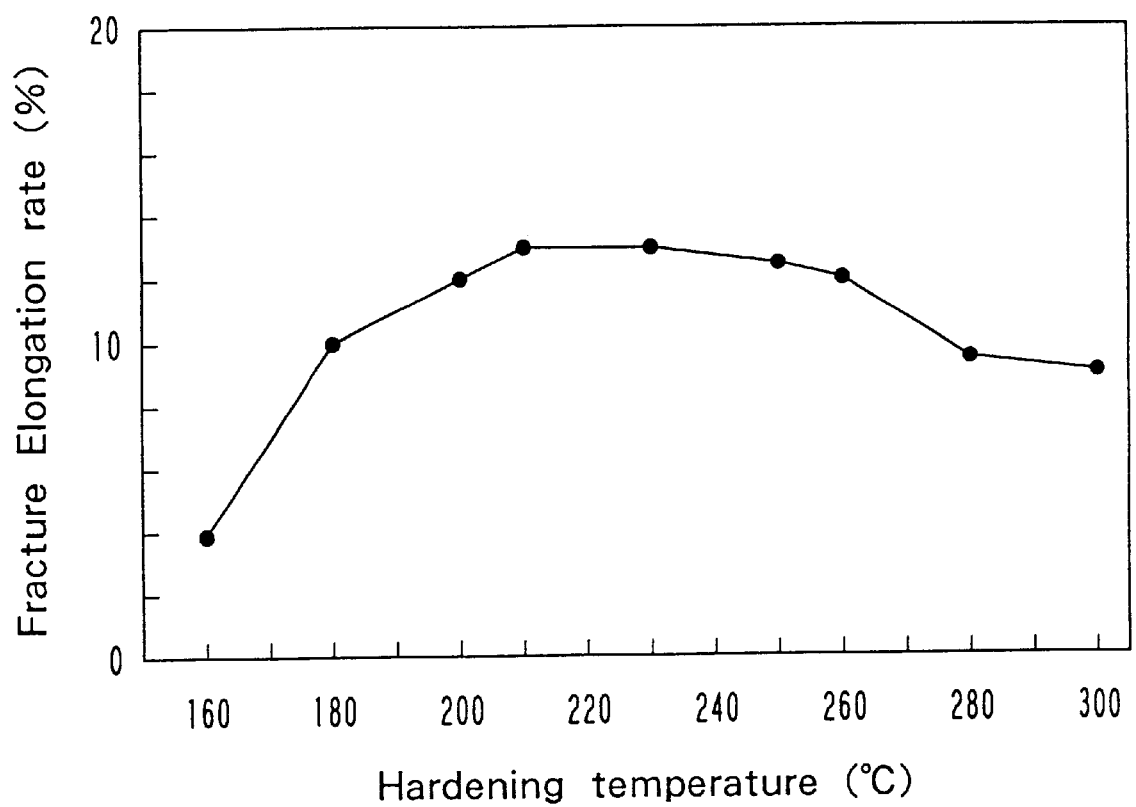
FIG. 4 is a graph showing a relationship between a hardening temperature and a fracture elongation rate in formation of a cover resist layer.

FIG. 4 is a graph showing a relationship between hardening temperature and fracture elongation rate in formation of the cover resist layer 9. The fracture elongation rate is an elongation rate in a moment of fracture caused by pulling both ends of a film. The larger the fracture elongation rate is, the more flexuous the film is judged to be. As can be seen from FIG. 4, if hardening temperature is set in a range of 180° C. to 260° C., the cover resist layer 9 can be obtained which is remarkably flexuous and has the fracture elongation rate of 10% or more.

Next, evaluation result of a carrier film will be explained, the carrier film being produced by forming the cover resist layer made of the epoxy acrylate resin including the fluorene skeleton on the heat-resistant resin film including the conductive wiring pattern.

First, as shown in FIG. 2A, tape matrix 4 was prepared which comprises the copper foil 1, the base layer 2 made from the heat-resistant resin film such as polyimide and the like, and the bonding layer 3 made of the thermoplastic polyimide and the like.

Next, the copper foil 1 was etched into the predetermined shape in the photo-lithography process to form the copper wiring pattern 5 (FIG. 2B).

Then, the through hole 6 was defined in the base layer 2 and the bonding layer 3 in a laser working process (FIG. 2C), and the through hole 6 was filled with metal by plating, to obtain the bump 7 for electrical connection to the semiconductor device (FIG. 2D).

Further, the epoxy acrylate resin including the fluorene skeleton was coated on the entire faces of the copper wiring pattern 5 and the base layer 2 in the spin-coating process, and was dried at temperature of 75° C. for 20 minutes. And, exposure of 600 mJ/cm$^2$ and dip developing for three minutes in aqueous solution including 1% of sodium carbonate decahydrate were carried out, to obtain the cover resist layer 9 having openings 8.

Finally, by heating the cover resist layer 9 for hardening at temperature of 230° C. for 30 minutes, the carrier film 10 was formed (FIG. 2E).

The cover resist layer 9 made of the epoxy acrylate resin including the fluorene skeleton had chemical resistance enough to prevent any problem in applying nickel or gold plating to the openings 8. Also, the cover resist 9 had heat resistance of 300° C. or more and excellent moisture resistance, having absorption rate of as low as 0.7%. As a result, the cover resist layer 9 did not suffer from problems of absorption and lack of heat resistance in the assembling process of the semiconductor device, and the carrier film 10 with excellent reliability could be obtained. And, contracting rate in hardening was 6% which was remarkably small as compared with contracting rate of 50% of the polyimide resin, and warping did not caused in the carrier film 10.

The present invention is not limited to the above embodiment, but can be modified variously. For example, the epoxy acrylate resin including the fluorene skeleton may be coated in the die-coating process, the curtain-coating process, or the print-coating process instead of the spin-coating process. Any of the above coating processes provides the carrier film with excellent quality and reliability like in the above embodiment.

The carrier film of the present invention is obtained by forming the cover resist layer made of the epoxy acrylate resin including the fluorene skeleton on the heat-resistant resin film including the conductive wiring pattern. Therefore, the carrier film does not warp, and has excellent heat resistance, moisture resistance, and chemical resistance. By using this carrier film, the semiconductor device with excellent reliability can be formed.

Furthermore, in the process for forming the carrier film, by forming the cover resist layer made of the epoxy acrylate resin including the fluorene skeleton by heating at temperature in a range of 180° C. to 260° C. for hardening, it is possible to obtain the carrier film which is remarkably flexuous and can be handled easily in the assembling process of the semiconductor device.

What is claimed is:

1. A process for producing a carrier film having a heat-resistant resin film including a conductive wiring pattern; and a cover resist layer made of epoxy acrylate resin including a fluorene skeleton and formed on said heat-resistant resin film, said process comprising:

forming said cover resist layer made of epoxy acrylate resin including the fluorene skeleton by heating at temperature in a range of 180° C. to 260° C. for hardening.

* * * * *